United States Patent
Park et al.

(10) Patent No.: US 9,680,451 B2
(45) Date of Patent: Jun. 13, 2017

(54) INTEGRATED CIRCUIT

(71) Applicant: SK hynix Inc., Gyeonggi-do (KR)

(72) Inventors: Yeh Seul Park, Gyeonggi-do (KR); Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 136 days.

(21) Appl. No.: 14/546,802

(22) Filed: Nov. 18, 2014

(65) Prior Publication Data

US 2015/0381155 A1     Dec. 31, 2015

(30) Foreign Application Priority Data

Jun. 30, 2014   (KR) .................. 10-2014-0081049

(51) Int. Cl.
   *H03B 1/00*     (2006.01)
   *H03K 3/00*     (2006.01)
   *H03K 3/356*    (2006.01)
(52) U.S. Cl.
   CPC .............. *H03K 3/356104* (2013.01)
(58) Field of Classification Search
   CPC ............................... H03K 3/356104

USPC ........................................... 327/109
See application file for complete search history.

(56) References Cited

U.S. PATENT DOCUMENTS

| 8,995,175 | B1* | 3/2015 | Liu .................. G11O 5/14 365/154 |
| 2004/0140835 | A1* | 7/2004 | Lehmann ............... G11C 17/16 327/208 |
| 2005/0285657 | A1* | 12/2005 | Watt .................... H01L 27/0285 327/313 |

FOREIGN PATENT DOCUMENTS

| KR | 1020020022125 | 3/2002 |
| KR | 1020030019858 | 3/2003 |

* cited by examiner

*Primary Examiner* — Lincoln Donovan
*Assistant Examiner* — Metasebia Retebo
(74) *Attorney, Agent, or Firm* — IP & T Group LLP

(57) ABSTRACT

An integrated circuit includes: a latch unit suitable for inverting a voltage level of a first node and driving a second node with the inverted voltage level of the first node, and inverting a voltage level of the second node and driving the first node with the inverted voltage level of the second node; and a sink unit coupled with one or more among the first and second nodes, and suitable for sinking a charge of the coupled node.

16 Claims, 4 Drawing Sheets

INTEGRATED CIRCUIT

CROSS-REFERENCE TO RELATED APPLICATIONS

The present application claims priority of Korean Patent Application No. 10-2014-0081049, filed on Jun. 30, 2014, which is incorporated herein by reference in its entirety.

BACKGROUND

1. Field

Exemplary embodiments of the present invention relate to a semiconductor design technology, and more particularly, to an integrated circuit for latching an input signal.

2. Description of the Related Art

An integrated circuit for latching an input signal is frequently used in diverse circuits.

FIG. 1 is a circuit diagram illustrating an integrated circuit for latching an input signal according to a prior art.

Referring to FIG. 1, the integrated circuit for latching an input signal IN includes two inverters INV1 and INV2.

An input terminal of the first inverter INV1 and an output terminal of the second inverter INV2 are coupled with each other, and an output terminal of the first inverter INV1 and an input terminal of the second inverter INV2 are coupled with each other. Therefore, logic levels of an input node IN and an output node OUT are in a complementary relationship to each other.

For example, when the input node IN has a logic high level, the output node OUT has a stable logic low level. In contrast, when the input node IN has a logic low level, the output node OUT has a stable logic high level. A latch circuit formed of the inverters INV1 and INV2 has and holds two different stable logic states at the Input node IN and the output node OUT.

Since the latch circuit formed of the inverters INV2 and IN2 is stable, noise has not become a problem.

However, as the latch circuit is exposed to radioactive rays having ionization characteristics, it is influenced by generated electric charges. That is, the radiation of radioactive rays makes the memory state of the latch circuit unstable, and increases the possibility of a malfunction called 'an inversion of the memory state'.

This phenomenon is referred to as a soft error, which is caused by α-rays emitted, from package materials or wiring materials, among the radioactive rays having ionization characteristics.

Particularly, soft errors occur more easily as power source voltages become lower. For this reason, in recent semiconductor memory devices driven by a low power source, it is important to increase the resistance to soft errors.

SUMMARY

Exemplary embodiments of the present invention are directed to an integrated latch circuit capable of preventing a soft error.

In accordance with an embodiment of the present invention, an integrated circuit includes: a latch unit suitable for inverting a voltage level of a first node and driving a second node with the inverted voltage level of the first node, and inverting a voltage level of the second node and driving the first node with the inverted voltage level of the second node; and a sink unit coupled with one or more among the first and second nodes, and suitable for sinking a charge of the coupled node.

In accordance with another embodiment of the present invention, an integrated circuit includes: a first inversion driving block suitable for inverting a voltage level of a first node and driving a second node with the inverted voltage level of the first node, and sinking a charge of the second node; and a second inversion driving block suitable for inverting a voltage level of the second node and driving the first node with the inverted voltage level of the second node, and sinking a charge of the first node.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

Figure 1:
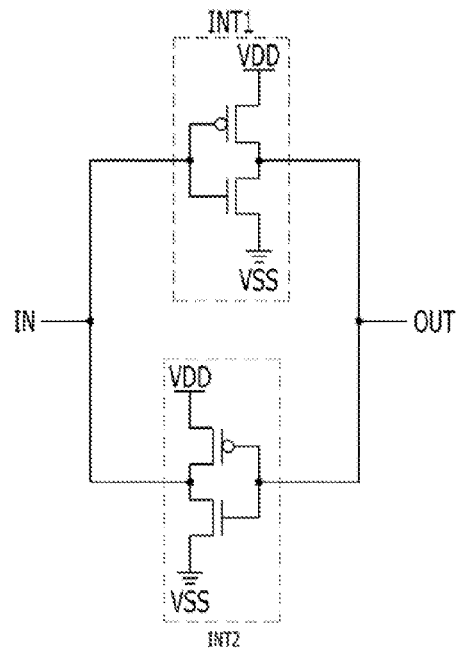
FIG. 1 is a circuit diagram illustrating an integrated circuit for latching an input signal according to a prior art.
Figure 2:
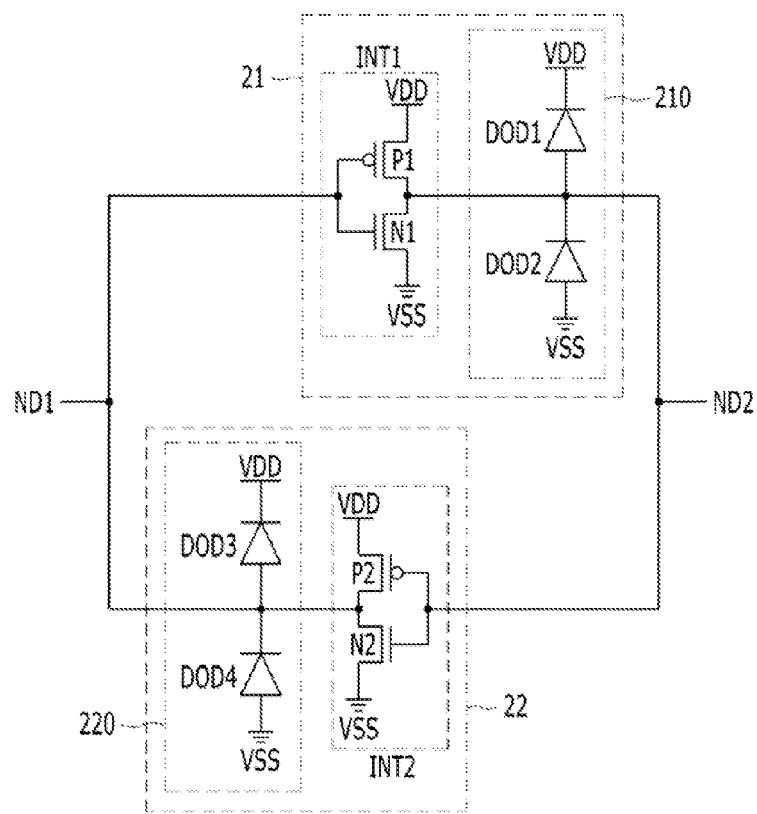
FIGS. 2 and 3 are circuit diagrams illustrating an integrated circuit for latching an input signal in accordance with an embodiment of the present invention.
Figure 3:
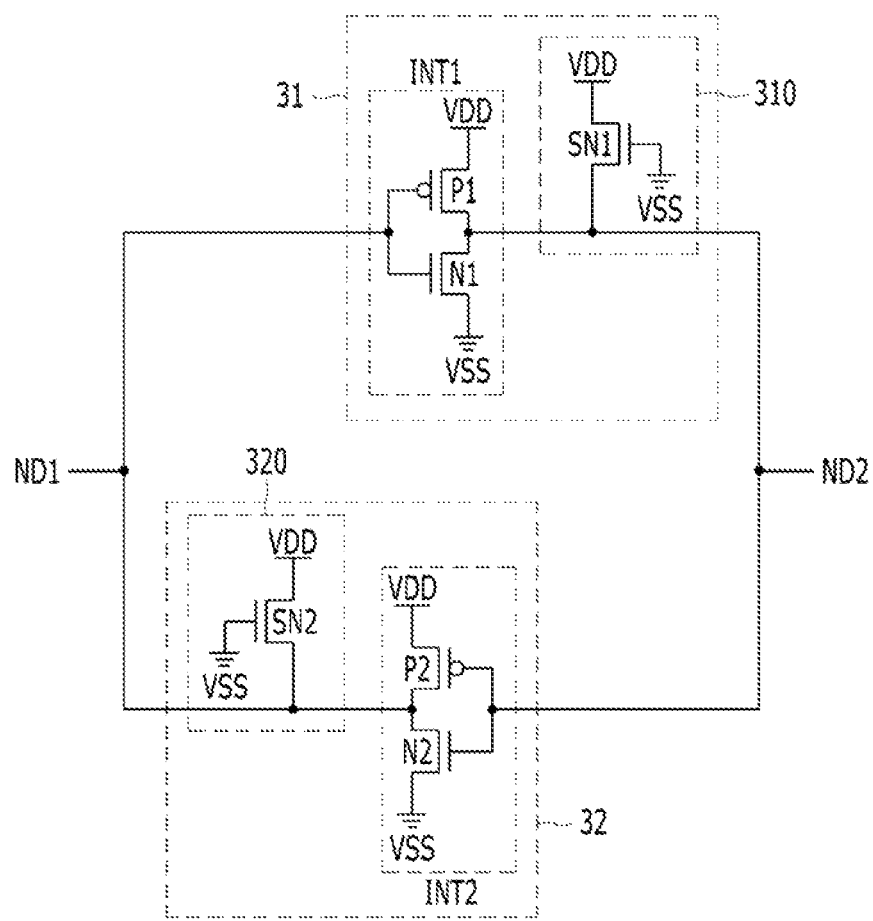

FIGS. 2 and 3 are circuit diagrams illustrating an integrated circuit for latching an input signal in accordance with an embodiment of the present invention.

Referring to FIGS. 2 and 3, the integrated circuit may include latch units INT1 and INT2 and sink units 210 and 220, and 310 and 320.

The latch units INT1 and INT2 may invert and drive a voltage level of a first node ND1 to a voltage level of a second node ND2, and may invert and drive the voltage of the second node ND2 to the voltage level of the first node ND1 with the inverted voltage. The latch units INT1 and INT2 may include a first inverter INV1 for inverting and driving the voltage level of the first node ND1 to the voltage level of the second node ND2, and a second inverter INV2 for inverting and driving the voltage level of the second node ND2 to the voltage level of the first node ND1.

The sink units 210 and 220, and 310 and 320 may be coupled with at least one among the first node ND1 and the second node ND2, and may sink a charge of the coupled node. For example, the sink units 210 and 220, and 310 and 320 may be coupled with both of the first node ND1 and the second node ND2 as illustrated in the drawings, and may sink charges of the first and second nodes ND1 and ND2. Also, although not illustrated, one of the sink units 210 and 220, and 310 and 320, for example the sink unit 210 and 310 may be coupled only with the first node ND1, and may sink the charge of the first node ND1. Similarly, one of the sink units 210 and 220, and 310 and 320, for example the sink unit 220 and 320 may be coupled only with the second node ND2, and may sink the charge of the second node ND2.

Referring to FIG. 2, the sink units 210 and 220 may include a first diode DOD1 or DOD3 coupled in a direction toward a power source voltage VDD between the power source voltage VDD and one or more among the first and second nodes ND1 and ND2, and a second diode DOD2 or DOD4 coupled in a direction toward the power source voltage VDD between the ground voltage VSS and one or more among the first and second nodes ND1 and ND2. The sink units 210 and 220 may sink a charge of the first and second nodes ND1 and ND2 based on a reverse bias characteristic of the diode.

Referring to FIG. 3, the sink units 310 and 320 may include an NMOS transistor SN1 or SN2 coupled with one or more among the first and second nodes ND1 and ND2 at its source, coupled with a ground voltage VSS at its gate, and coupled with the power source voltage VDD at its drain. The sink units 310 and 320 may sink a charge of the first and second nodes ND1 and ND2 based on an off leakage current characteristic of the NMOS transistor.

The sink units 210 and 220, and 310 and 320 coupled with the first and second node ND1 and ND2 may sink charges, which may be generated on the first and second nodes ND1 and ND2 due to the soft error of the latch units INT1 and INT2, by sinking the charges to the power source voltage VDD or the ground voltage VSS. Thus, electric potentials of the first and second nodes ND1 and ND2 may be prevented from changing although the soft error occurs in the latch units INT1 and INT2.

Figure 4:
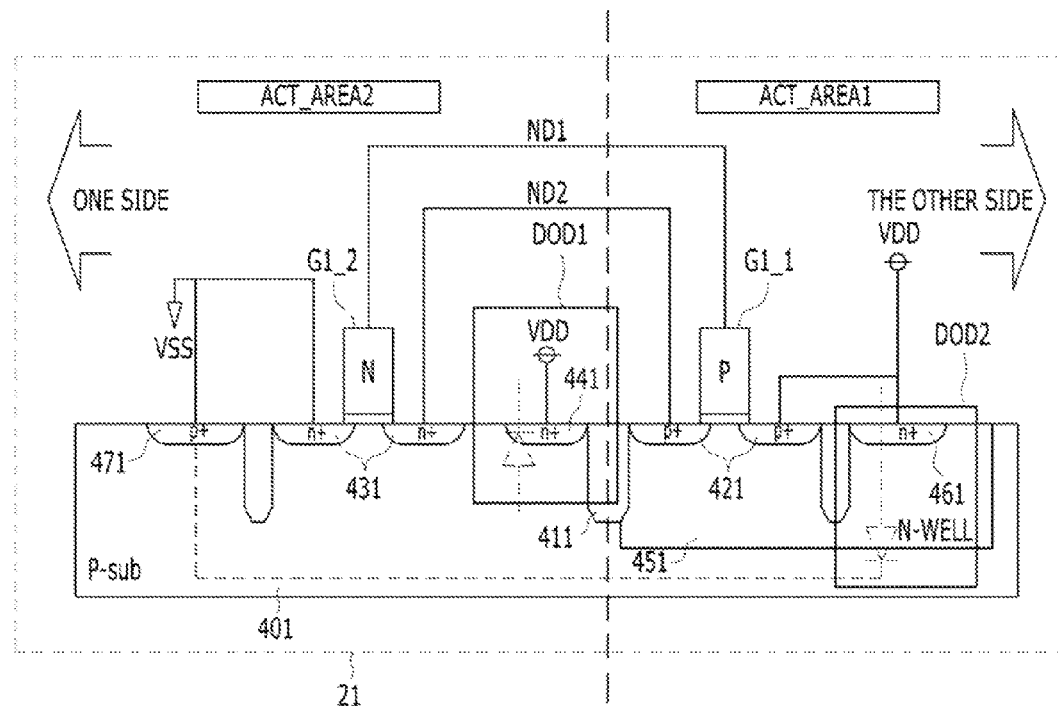
FIGS. 4 and 5 are cross-sectional views illustrating an integrated circuit for latching the input signal shown in FIGS. 2 and 3.
Figure 4:
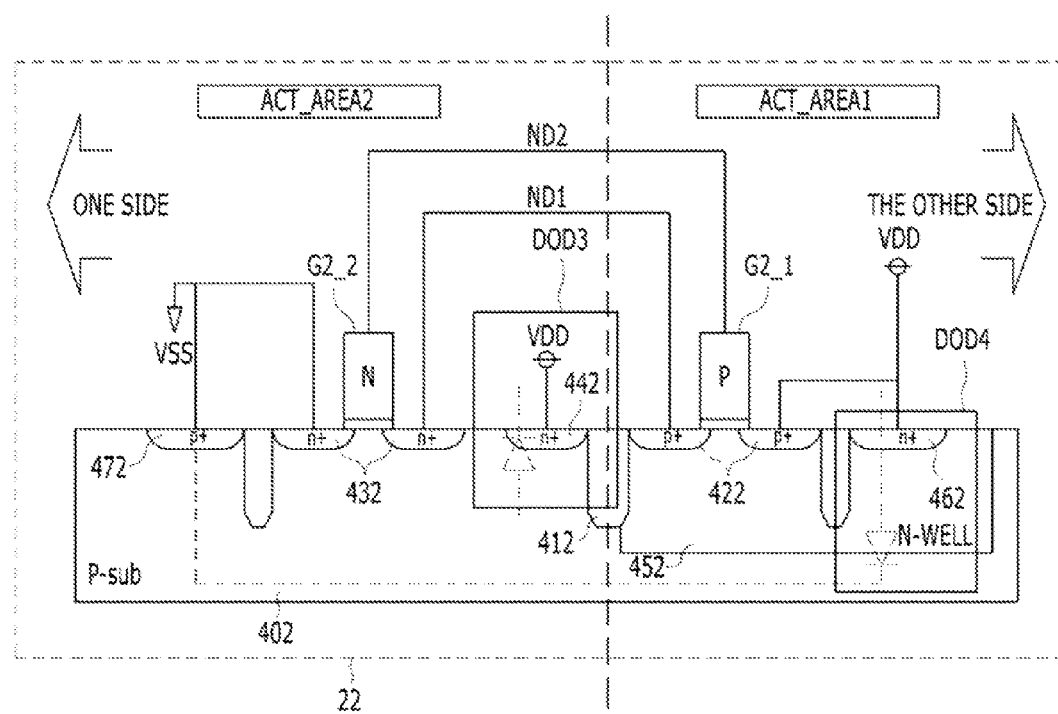
Figure 5:
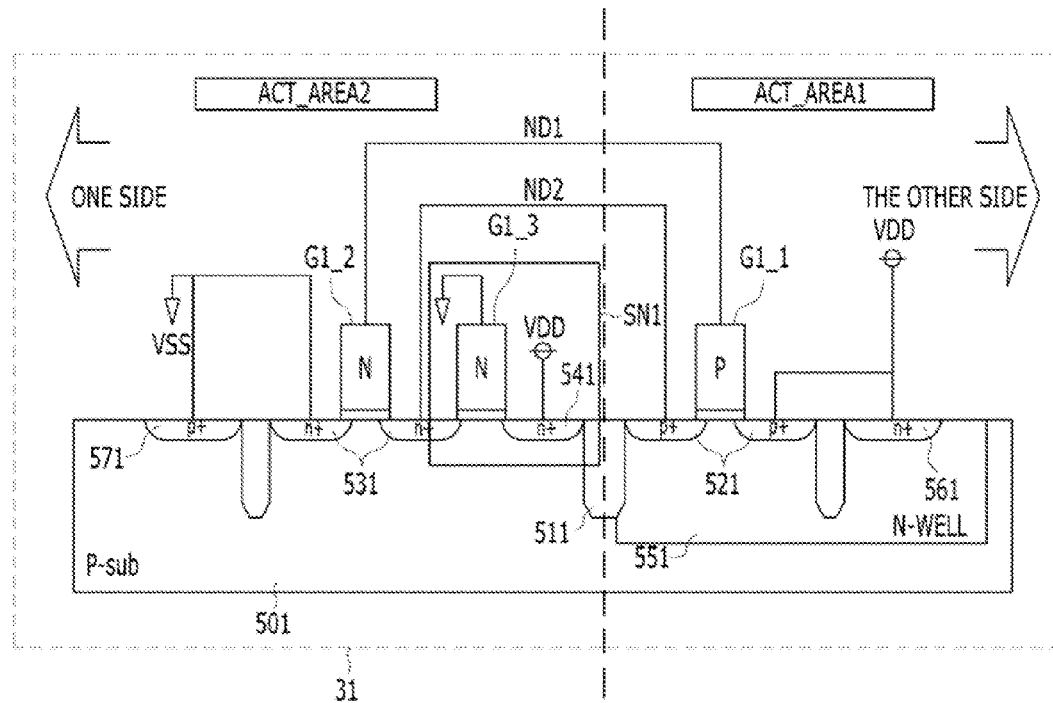
Figure 5:
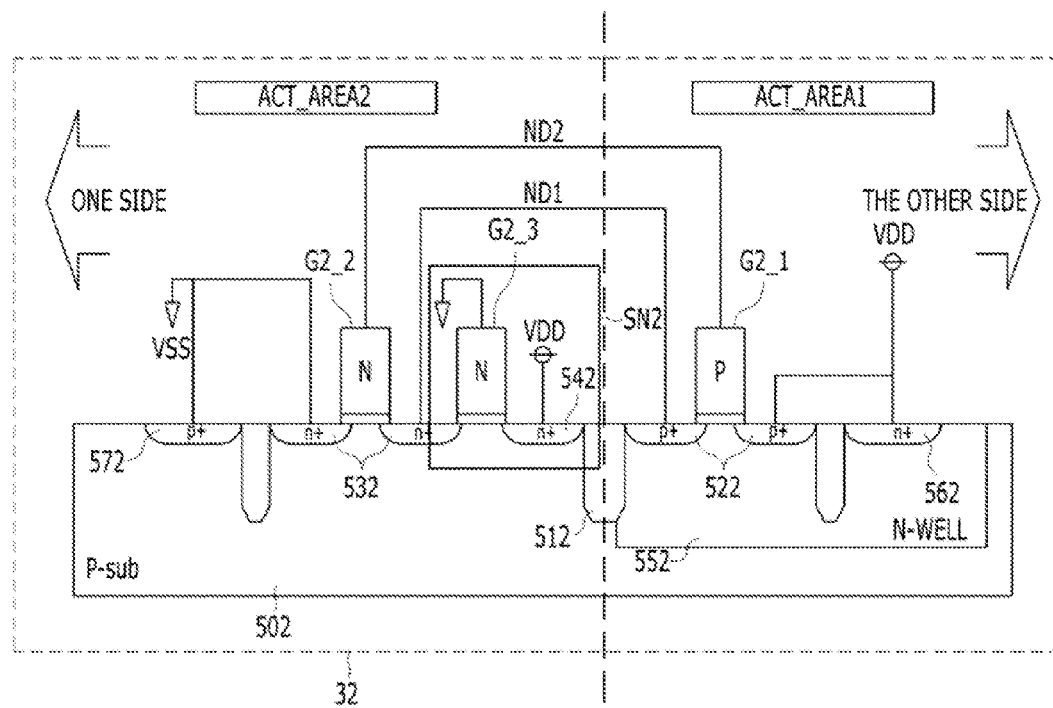

FIGS. 4 and 5 are cross-sectional views illustrating the integrated circuit for latching the input signal shown in FIGS. 2 and 3.

The integrated circuit in accordance with the embodiment of the present invention with reference to FIGS. 2 and 3 may include the latch units INT1 and INT2 and the sink units 210 and 220, and 310 and 320. The latch unit INT1 or a first inverter INV1 and the sink unit 210 and 310 may be grouped as a first inversion driving block 21 and 31, and the latch unit INT2 or a second inverter INV2 and the sink unit 220 and 320 may be grouped as a second inversion driving block 22 and 32.

In other words, the first inversion driving block 21 and 31 may include the first inverter INV1 of the latch units INT1 and INT2 and the circuits 210 and 310 coupled with the second node ND2 that is the output node of the first inverter INV1, and may sink the charge of the second node ND2.

Therefore, the first inversion driving block 21 and 31 may invert and drive the voltage level of the first node ND1 to the voltage level of the second node ND2, and may sink the charge of the second node ND2.

The second inversion driving block 22 and 32 may include the second inverter INV2 of the latch units INT1 and INT2 and the circuits 220 and 320 coupled with the first node ND1 that is the output node of the second inverter INV2, and may sink the charge of the first node ND1.

Therefore, the second inversion driving block 22 and 32 may invert and drive the voltage level of the second node ND2 to the voltage level of the first node ND1, and may sink the charge of the first node ND1.

FIG. 4 illustrates a cross-sectional view of the first inversion driving block 21 shown in FIG. 2.

The first inversion driving block 21 may include an isolation layer 411, a first gate G1_1, a first junction region 421, a second gate G1_2, a second junction region 431, a rectifier element DOD1, a well 451, a first pick-up region 461, and a second pick-up region 471. The isolation layer 411 may define a first active region ACT_AREA1 formed over a substrate 401, and a second active region ACT_AREA2 formed on one side of the first active region ACT_AREA1. The first gate G1_1 may be formed in the first active region ACT_AREA1, and may be coupled with the first node ND1. The first junction region 421 may be formed over the substrate 401 on both sides of the first gate G1_1. The second gate G1_2 may be formed in the second active region ACT_AREA2, and may be coupled with the first node ND1. The second junction region 431 may be formed over the substrate 401 on both sides of the second gate G1_2. The rectifier element DOD1 may be formed in the second active region ACT_AREA2 between the first junction region 421 and the second junction region 431 facing each other. The well 451 may be formed over the substrate 401 corresponding to the first active region ACT_AREA1. The substrate 401 and the well 451 may be complementarily conductive to each other. The first pick-up region 461 may be formed in the well 451 on one side of the isolation layer 411 defining the first active region ACT_AREA1. The second pick-up region 471 may be formed over the substrate 401 on one side of the isolation layer 411 defining the second active region ACT_AREA2. In the first inverter INV1, the power source voltage VDD may be applied to the first junction region 421 on the other side of the first gate G1_1, the second node ND2 may be coupled with the first junction region 421 on one side of the first gate G1_1 and the second junction region 431 on the other side of the second gate G1_2, and the ground voltage VSS may be applied to the second junction region 431 on one side of the second gate G1_2.

The rectifier element DOD1 may include an impurity region 441, which is formed to be spaced apart from the second junction region 431, and may be complementarily conductive to the substrate 401. A rectifier element DOD2 may be additionally formed of the first pick-up region 461, the well 451, the substrate 401, and the second pick-up region 471. The power source voltage VDD may be applied to the first pick-up region 461, and the ground voltage VSS may be applied to the second pick-up region 471, and the power source voltage VDD may be applied to the impurity region 441. Thus, the rectifier element DOD1 may be the first diode DOD1 coupled between the first node ND1 and the power source voltage VDD, and may be coupled in the direction toward the power source voltage VDD. The rectifier element DOD2 may be the second diode DOD2 coupled between the first node ND1 and the ground voltage VSS, and may be coupled in the direction toward the power source voltage VDD.

FIG. 4 also illustrates a cross-sectional view of the second inversion driving block 22 shown in FIG. 2.

The second inversion driving block 22 may include an isolation layer 412, a first gate G2_1, a first junction region 422, a second gate G2_2, a second junction region 432, a rectifier element DOD3, a well 452, a first pick-up region 462, and a second pick-up region 472. The isolation layer 412 may define a first active region ACT_AREA1 formed over a substrate 402, and a second active region ACT_AREA2 formed on one side of the first active region ACT_AREA1. The first gate G2_1 may be formed in the first active region ACT_AREA1, and may be coupled with the second node ND2. The first junction region 422 may be formed over the substrate 402 on both sides of the first gate G2_1. The second gate G2_2 may be formed in the second active region ACT_AREA2, and may be coupled with the second node ND2. The second junction region 432 may be formed over the substrate 402 on both sides of the second gate G2_2. The rectifier element DOD3 may be formed in the second active region ACT_AREA2 between the first junction region 422 and the second junction region 432 facing each other. The well 452 may be formed over the substrate 402 corresponding to the first active region ACT_AREA1. The substrate 402 and the well 452 may be complementarily conductive to each other. The first pick-up region 462 may be formed in the well 452 on one side of the isolation layer 412 defining the first active region ACT_AREA1. The second pick-up region 472 may be formed over the substrate 402 on one side of the isolation layer 412 defining the second active region ACT_AREA2. In the second inverter INV2, the power source voltage VDD may be applied to the first junction region 422 on the other side of the first gate G2_1, the first node ND1 may be coupled with the first junction region 422 on one side of the first gate G2_1 and the second junction region 432 on the other side of the second gate G2_2, and the ground voltage VSS may be applied to the second junction region 432 on one side of the second gate G2_2.

The rectifier element DOD3 may include an impurity region 442, which is formed to be spaced apart from the second junction region 432, and may be complementarily conductive to the substrate 402. A rectifier element DOD4 may be additionally formed of the first pick-up region 462, the well 452, the substrate 402, and the second pick-up region 472. The power source voltage VDD may be applied to the first pick-up region 462, and the ground voltage VSS may be applied to the second pick-up region 472, and the power source voltage VDD may be applied to the impurity region 442. Thus, the rectifier element DOD3 may be the first diode DOD3 coupled between the second node ND2 and the power source voltage VDD, and may be coupled in the direction toward the power source voltage VDD. The rectifier element DOD4 may be the second diode DOD4 coupled between the second node ND2 and the ground voltage VSS, and may be coupled in the direction toward the power source voltage VDD.

FIG. 5 illustrates a cross-sectional view of the first inversion driving block 31 shown in FIG. 3.

The first inversion driving block 31 may include an isolation layer 511, a first gate G1_1, a first junction region 521, a second gate G1_2, a second junction region 531, a rectifier element SN1, a well 551, a first pick-up region 561, and a second pick-up region 571. The isolation layer 511 may define a first active region ACT_AREA1 formed over a substrate 501, and a second active region ACT_AREA2 formed on one side of the first active region ACT_AREA1. The first gate G1_1 may be formed in the first active region ACT_AREA1, and may be coupled with the first node ND1. The first junction region 521 may be formed over the substrate 501 on both sides of the first gate G1_1. The second gate G1_2 may be formed in the second active region ACT_AREA2, and may be coupled with the first node ND1. The second junction region 531 may be formed over the substrate 501 on both sides of the second gate G1_2. The rectifier element SN1 may be formed in the second active region ACT_AREA2 between the first junction region 521 and the second junction region 531 facing each other. The well 551 may be formed over the substrate 501 corresponding to the first active region ACT_AREA1. The substrate 501 and the well 551 may be complementarily conductive to each other. The first pick-up region 561 may be formed in the well 551 on one side of the isolation layer 511 defining the first active region ACT_AREA1. The second pick-up region 571 may be formed over the substrate 501 on one side of the isolation layer 511 defining the second active region ACT_AREA2. In the first inverter INV1, the power source voltage VDD may be applied to the first junction region 521 on the other side of the first gate G1_1, the second node ND2 may be coupled with the first junction region 521 on one side of the first gate G1_1 and the second junction region 531 on the other side of the second gate G1_2, and the ground voltage VSS may be applied to the second junction region 531 on one side of the second gate G1_2.

The rectifier element SN1 may include a third gate G1_3, which is formed in the second active region ACT_AREA2 and is formed to be spaced apart from the second gate G1_2, and a third junction region 541, which is formed on the other side of the third gate G1_3. The ground voltage VSS may be applied to the third gate G1_3, and the power source voltage VDD may be applied to the third junction region 541. The rectifier element SN1 may share the second junction region 531 between the second gate G1_2 and the third gate G1_3. Thus, the rectifier element SN1 may be the NMOS transistor SN1 coupled with the first node ND1 at its source, coupled with the ground voltage VSS at its gate, and coupled with the power source voltage VDD at its drain.

FIG. 5 also illustrates a cross-sectional view of the second inversion driving block 32 shown in FIG. 3.

The second inversion driving block 32 may include an isolation layer 512, a first gate G2_1, a first junction region 522, a second gate G2_2, a second junction region 532, a rectifier element SN2, a well 552, a first pick-up region 562, and a second pick-up region 572. The isolation layer 512 may define a first active region ACT_AREA1 formed over a substrate 502, and a second active region ACT_AREA2 formed on one side of the first active region ACT_AREA1. The first gate G2_1 may be formed in the first active region ACT_AREA1 and coupled with the second node ND2. The first junction region 522 may be formed over the substrate 502 on both sides of the first gate G2_1. The second gate G2_2 may be formed in the second active region ACT_AREA2, and may be coupled with the second node ND2. The second junction region 532 may be formed over the substrate 502 on both sides of the second gate G2_2. The rectifier element SN2 may be formed in the second active region ACT_AREA2 between the first junction region 522 and the second junction region 532 facing each other. The well 552 may be formed over the substrate 502 corresponding to the first active region ACT_AREA1. The substrate 502 and the well 552 may be complementarily conductive to each other. The first pick-up region 562 may be formed in the well 552 on one side of the isolation layer 512 defining the first active region ACT_AREA1. The second pick-up region 572 may be formed over the substrate 502 on one side of the isolation layer 512 defining the second active region ACT_AREA2. In the second inverter INV2, the power source voltage VDD may be applied to the first junction region 522 on the other side of the first gate G2_1, the second node ND2 may be coupled with the first junction region 522 on one side of the first gate G2_1 and the second junction region 532 on the other side of the second gate G2_2, and the ground voltage VSS may be applied to the second junction region 532 on one side of the second gate G2_2.

The rectifier element SN2 may include a third gate G2_3, which is formed in the second active region ACT_AREA2 and is formed to be spaced apart from the second gate G2_2, and a third junction region 542, which is formed on the other side of the third gate G2_3. The ground voltage VSS may be applied to the third gate G2_3, and the power source voltage VDD may be applied to the third junction region 542. The rectifier element SN2 may share the second junction region 532 between the second gate G2_2 and the third gate G2_3 and is coupled with the second node ND2. Thus, the rectifier element SN2 may be the NMOS transistor SN2 coupled with the second node ND2 at its source, coupled with the ground voltage VSS at its gate, and coupled with the power source voltage VDD at its drain.

The embodiments of the present invention have an advantage in that a charge caused by the soft error in the input node or an output node of a latch circuit may be sunk using a diode or a transistor.

Consequently, the embodiments of the present invention have an advantage in that an operation of the latch circuit operation may be stably performed by preventing the inversion of a memory state even when the soft error occurs in the latch circuit.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

Also, dispositions and types of logic gates and transistors described in the aforementioned embodiments may be implemented differently based on the polarity of the inputted signal.

What is claimed is:

1. An integrated circuit, comprising:
    a latch unit suitable for inverting a voltage level of a first node and driving a second node with the inverted voltage level of the first node, and inverting a voltage level of the second node and driving the first node with the inverted voltage level of the second node; and
    a sink unit coupled with one or more among the first and second nodes, and suitable for sinking a charge of the coupled node,
    wherein the sink unit includes an NMOS transistor coupled with one or more among the first and second nodes at its source, coupled with the ground voltage at its gate, and coupled with the power source voltage at its drain.

2. The integrated circuit of claim 1, wherein the latch unit includes:
    a first inverter suitable for inverting the voltage level of the first node, and driving the second node with the inverted voltage level of the first node in response to the voltage level of the first nod; and
    a second inverter suitable for inverting the voltage level of the second node and driving the first node with the inverted voltage level of the second node in response to the voltage level of the second node.

3. An integrated circuit, comprising:
    a first inversion driving block suitable for inverting a voltage level of a first node and driving a second node with the inverted voltage level of the first node, and sinking a charge of the second node; and
    a second inversion driving block suitable for inverting a voltage level of the second node and driving the first node with the inverted voltage level of the second node, and sinking a charge of the first node,
    wherein the first inversion driving block includes:
    an isolation layer defining a first active region formed over a substrate, and a second active region formed on one side of the first active region;
    a first gate formed in the first active region, and coupled with the first node;
    a first junction region formed over the substrate on both sides of the first gate;
    a first gate formed in the second active region, and coupled with the first node;
    a second junction region formed over the substrate on both sides of the first gate; and
    a rectifier element formed in the second active region between the first junction region and the second junction region facing each other,
    wherein a power source voltage is applied to the first junction region on the other side of the first gate,
    wherein the second node is coupled with the first junction region on one side of the first gate and the second junction region on the other side of the first gate, and
    wherein a ground voltage is applied to the second junction region on one side of the first gate.

4. The integrated circuit of claim 3, further comprising:
    a well formed over the substrate corresponding to the first active region,
    wherein the substrate and the well are complementarily conductive to each other.

5. The integrated circuit of claim 4, further comprising:
    a first pick-up region formed in the well on one side of the isolation layer defining the first active region; and
    a second pick-up region formed over the substrate on one side of the isolation layer defining the second active region.

6. The integrated circuit of claim 5, further comprising an additional rectifier element formed of the first pick-up region, the well, the substrate, and the second pick-up region.

7. The integrated circuit of claim 6, wherein the rectifier element includes an impurity region formed to be spaced apart from the second junction region, and complementarily conductive to the substrate.

8. The integrated circuit of claim 7,
    wherein a power source voltage is applied to the first pick-up region,
    wherein a ground voltage is applied to the second pick-up region,
    wherein a power source voltage is applied to the impurity region, and
    wherein a reverse bias is applied to the rectifier element and the additional rectifier element.

9. The integrated circuit of claim 3, wherein the rectifier element includes:
    a third gate formed in the second active region, formed to be spaced apart from the first gate, and suitable for receiving a ground voltage; and
    a third junction region formed on the other side of the third gate, and suitable for receiving a power source voltage,
    wherein the rectifier element shares the second junction region between the first gate and the third gate, and is coupled with the second node.

10. The integrated circuit of claim 3, wherein the second inversion driving block includes:
    an isolation layer defining a first active region formed over a substrate, and a second active region formed on one side of the first active region;
    a first gate formed in the first active region, and coupled with the second node;
    a first junction region formed over the substrate on both sides of the first gate;
    a first gate formed in the second active region, and coupled with the second node;
    a second junction region formed over the substrate on both sides of the first gate; and
    a rectifier element formed in the second active region between the first junction region and the second junction region facing each other,
    wherein a power source voltage is applied to the first junction region on the other side of the first gate, wherein the first node is coupled with the first junction region on one side of the first gate and the second junction region on the other side of the first gate, and wherein a ground voltage is applied to the second junction region on one side of the first gate.

11. The integrated circuit of claim 10, further comprising:
a well formed over the substrate corresponding to the first active region, wherein the substrate and the well are complementarily conductive to each other.

12. The integrated circuit of claim 11, further comprising:
a first pick-up region formed in the well on one side of the isolation layer defining the first active region; and
a second pick-up region formed over the substrate on one side of the isolation layer defining the second active region.

13. The integrated circuit of claim 12, further comprising an additional rectifier element formed of the first pick-up region, the well, the substrate, and the second pick-up region.

14. The integrated circuit of claim 13, wherein the rectifier element includes an impurity region formed to be spaced apart from the second junction region and complementarily conductive to the substrate.

15. The integrated circuit of claim 14, wherein a power source voltage is applied to the first pick-up region, wherein a ground voltage is applied to the second pick-up region, wherein a power source voltage is applied to the impurity region, and wherein a reverse bias is applied to the rectifier element and the additional rectifier element.

16. The integrated circuit of claim 10, wherein the rectifier element includes:

a third gate formed in the second active region, formed to be spaced apart from the first gate, and suitable for receiving a ground voltage; and a third junction region formed on the other side of the third gate, and suitable for receiving a power source voltage, wherein the rectifier element shares the second junction region between the first gate and the third gate, and is coupled with the first node.

\* \* \* \* \*